(12) United States Patent
Barth, Jr. et al.

(10) Patent No.: US 8,097,525 B2
(45) Date of Patent: Jan. 17, 2012

(54) VERTICAL THROUGH-SILICON VIA FOR A SEMICONDUCTOR STRUCTURE

(75) Inventors: John E. Barth, Jr., Williston, VT (US); Kerry Bernstein, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 12/201,580

(22) Filed: Aug. 29, 2008

(65) Prior Publication Data

US 2010/0052108 A1    Mar. 4, 2010

(51) Int. Cl.
*H01L 21/00*    (2006.01)
(52) U.S. Cl. ........................................................ 438/463
(58) Field of Classification Search .................. None
See application file for complete search history.

(56) References Cited

U.S. PATENT DOCUMENTS

| | | | |
|---|---|---|---|
| 4,811,082 A * | 3/1989 | Jacobs et al. | 257/700 |
| 5,474,651 A | 12/1995 | Huebner | |
| 6,686,619 B2 * | 2/2004 | Nakamura et al. | 257/297 |
| 6,781,650 B1 * | 8/2004 | Colgan et al. | 349/110 |
| 6,878,608 B2 | 4/2005 | Brofman et al. | |
| 6,911,392 B2 * | 6/2005 | Bieck et al. | 438/667 |
| 7,276,787 B2 * | 10/2007 | Edelstein et al. | 257/698 |
| 7,344,959 B1 | 3/2008 | Pogge et al. | |
| 7,364,985 B2 * | 4/2008 | Kirby | 438/463 |
| 2007/0045708 A1 | 3/2007 | Lung | |
| 2007/0117348 A1 | 5/2007 | Ramanathan et al. | |
| 2007/0190692 A1 | 8/2007 | Erturk et al. | |

OTHER PUBLICATIONS

U.S. Appl. No. 11/833,112, filed Aug. 2, 2007.

* cited by examiner

*Primary Examiner* — Charles Garber
*Assistant Examiner* — Andre' C Stevenson
(74) *Attorney, Agent, or Firm* — Cantor Colburn LLP; Vazken Alexanian

(57) ABSTRACT

A semiconductor structure includes at least one silicon substrate having first and second planar surfaces, and at least one through silicon via filled with a conductive material and extending vertically through the first planar surface of the at least one silicon substrate to the second planar surface thereof. The through silicon via forms a vertical interconnection between a plurality of electronic circuits and an amount of dielectric insulation surrounding the through silicon via is varied based on a defined function of the through silicon via.

18 Claims, 2 Drawing Sheets

VERTICAL THROUGH-SILICON VIA FOR A SEMICONDUCTOR STRUCTURE

BACKGROUND

The present invention relates to a semiconductor structure, and more specifically, to a vertical through silicon via (TSV) for providing vertical interconnection in a semiconductor structure.

In electronics, a through-silicon via (TSV) is a vertical electrical connection that passes through a silicon wafer, for example. TSV technology is important in creating 3D packages and 3D integrated circuits. A 3D package contains two or more chips (i.e., integrated circuits) stacked vertically. In some 3D packages, TSVs replace edge wiring by creating vertical connections through the body of the chips, for example. Conventionally, the vertical through-via has been considered an impediment to high speed signals rather than as an asset. Further, the vertical interconnect is not used in a manner which enhances signal transfer or power supply distribution.

SUMMARY

The present invention provides a semiconductor structure which includes a vertical TSV which is tailored to enhance a defined function of the TSV, and useful for providing a vertical wafer-to-wafer or chip-to-chip interconnect structure.

According to one embodiment of the present invention, a semiconductor structure is disclosed. The semiconductor structure includes at least one silicon substrate having first and second planar surfaces, and at least one through silicon via filled with a conductive material and extending vertically through the first planar surface of the at least one silicon substrate to the second planar surface thereof, forming a vertical interconnection between a plurality of electronic circuits, wherein an amount of dielectric insulation surrounding the through silicon via is varied based on a defined function of the through silicon via.

In another embodiment of the present invention, a semiconductor structure is disclosed. The semiconductor structure includes at least one silicon substrate having first and second planar surfaces, and at least one through silicon via filled with a conductive material and extending vertically through the first planar surface of the at least one silicon substrate to the second planar surface thereof, forming a vertical interconnection between a plurality of electronic circuits, and creating a ground connection using the through silicon via.

In another embodiment of the present invention, a method of forming a through silicon via in a semiconductor structure is disclosed. The method includes forming a through silicon via filled with a conductive material vertically extending through a first planar surface of a silicon substrate and a second planar surface thereof, to create a vertical interconnection between a plurality of electronic circuits, and varying an amount of dielectric insulation surrounding the through silicon via based on a defined function of the through silicon via.

In another embodiment of the present invention, a method of forming a ground connection using a through silicon via in a semiconductor structure is disclosed. The method includes forming a through silicon via filled with a conductive material vertically extending through a first planar surface of a silicon substrate and a second planar surface thereof, to create a vertical interconnection between a plurality of electronic circuits, and creating a ground connection using the through silicon via.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
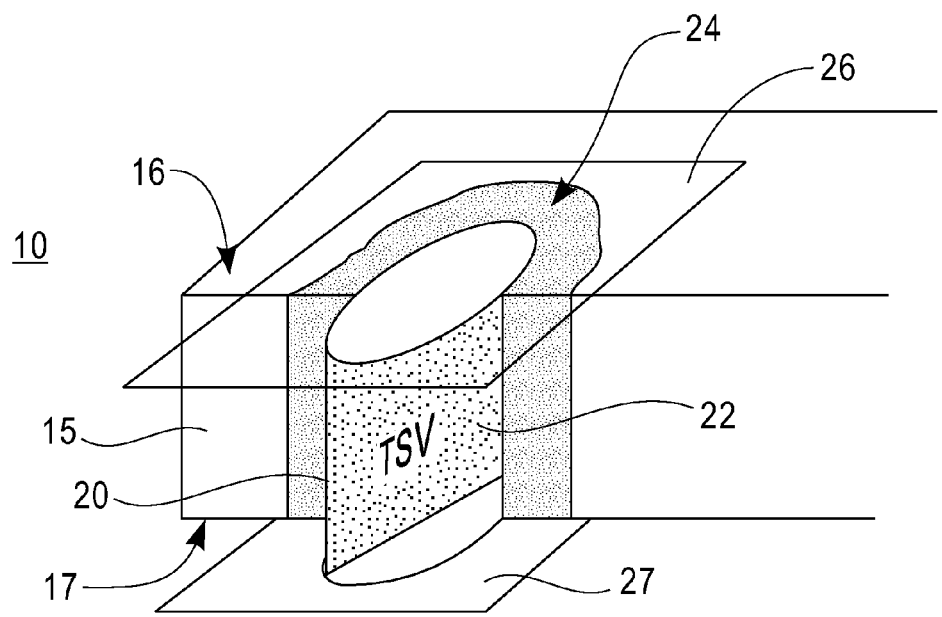
FIG. 1 is a schematic diagram of a semiconductor structure including a vertical TSV that can be implemented within embodiments of the present invention.

With reference now to FIG. 1, according to one embodiment of the present invention, a semiconductor structure 10 includes a vertical through silicon via 20 formed through at least one silicon surface 15 having first and second planar surfaces 16 and 17, and used in a stack assembly. According to an embodiment of the present invention, the silicon surface 15 may be a substrate, a wafer or other device. As mentioned above, the stack assembly may be a wafer-to-wafer or chip-to-chip configuration.

As shown in FIG. 1, the through silicon via 20 extends vertically through the silicon substrate 15 from the first planar surface 16 to the second planar surface 17 forming a vertical connection between a plurality of electronic circuits (not shown). Before filling the through silicon via 20 with a conductive material 22, a dielectric insulation 24 may be formed along the sidewalls of the through silicon via 20 to insulate the through silicon via 20, via an oxidation process or a deposition process, for example. After forming the dielectric insulation 24, the through silicon via 20 is filled with the conductive material 22. Thus, the through silicon via 20 is sufficiently isolated from the silicon substrate 15 once the through silicon via 20 is filled with the conductive material 22. According to one embodiment, the conductive material 22 is one of tungsten (W) or copper (Cu), for example.

According to one embodiment, the dielectric insulation 24 is formed of a high-k dielectric material having a dielectric constant greater than approximately 5 or a low-k dielectric material having a dielectric constant between approximately 2.0 to 3.0.

According to one embodiment, a thickness of the dielectric insulation 24 may vary based on the defined function of the through silicon via 20. For example, the through silicon via 20 may be used for signal transfer, for power supply connection or for ground connection. Specifically, the amount of dielectric insulation 24 is varied based on the defined function of the through silicon via 20; the presence or absence of the dielectric insulation 24, the thickness of the dielectric insulation 24 and the material of the dielectric insulation 24 (e.g., high-k or low-k dielectric) may all be changed. However, the present invention is not limited hereto. Thus, the through silicon via 20 may be varied in a suitable manner for any purpose disclosed herein.

According to the current embodiment, as shown in FIG. 1, the through silicon via 20 is used for the purpose of signal transfer between electronic circuits. Thus, the dielectric insulation 24 is relatively thick to support signal transfer with a minimum of parasitic capacitance. For example, the thickness of the dielectric insulation may be in terms of microns. Landing pads 26 and 27 are respectively formed above and below the through silicon via 20. When a signal passes through a chip (not shown) for example, the signal will pass through quickly with minimal impedance. As mentioned above, the through silicon via is not limited to being used for signal transfer. Therefore, alternative embodiments will be described below with reference to FIGS. 2 through 3.

Figure 2:
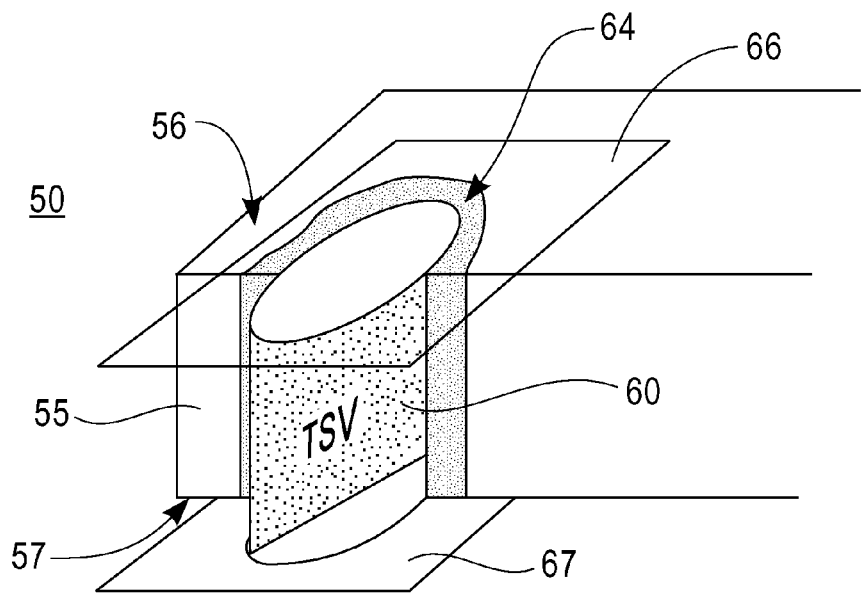
FIG. 2 is a schematic diagram of a semiconductor structure including a vertical TSV that can be implemented within alternative embodiments of the present invention.

FIG. 2 is a schematic diagram illustrating a semiconductor structure including a through silicon via that can be implemented within alternative embodiments of the present invention. Some of the features shown in FIG. 2 are the same as those features shown in FIG. 1 therefore a detailed description thereof has been omitted. Further, shown in FIG. 2, the thickness of the dielectric insulation is varied for the purpose of forming a power supply connection (for VDD supply). As shown in FIG. 2, a semiconductor structure 50 includes a silicon surface 55 having first and second planar surfaces 56 and 57 and a through silicon via 60 extending through the first and second planar surfaces 56 and 57. A thin dielectric insulation 64 is formed along the sidewalls of the through silicon via 60. The dielectric insulation 64 is of a thickness thin enough to provide increased power supply capacitive coupling while avoiding tunneling or dielectric breakdown. For example, the thickness of the dielectric insulation 64 ranges from between tens to hundreds of nanometers. Further, landing pads 66 and 67 are respectively formed at the first and second planar surfaces 56 and 57 and in contact with a top and a bottom portion of the through silicon via 60.

Thus, according to one embodiment, the dielectric insulation 22 of the through silicon via 20 (as depicted in FIG. 1) is thicker when performing signal transfer compared to the thickness of the dielectric insulation 64 of the through silicon via 60 shown in FIG. 2 used to provide supply rail access.

Figure 3:
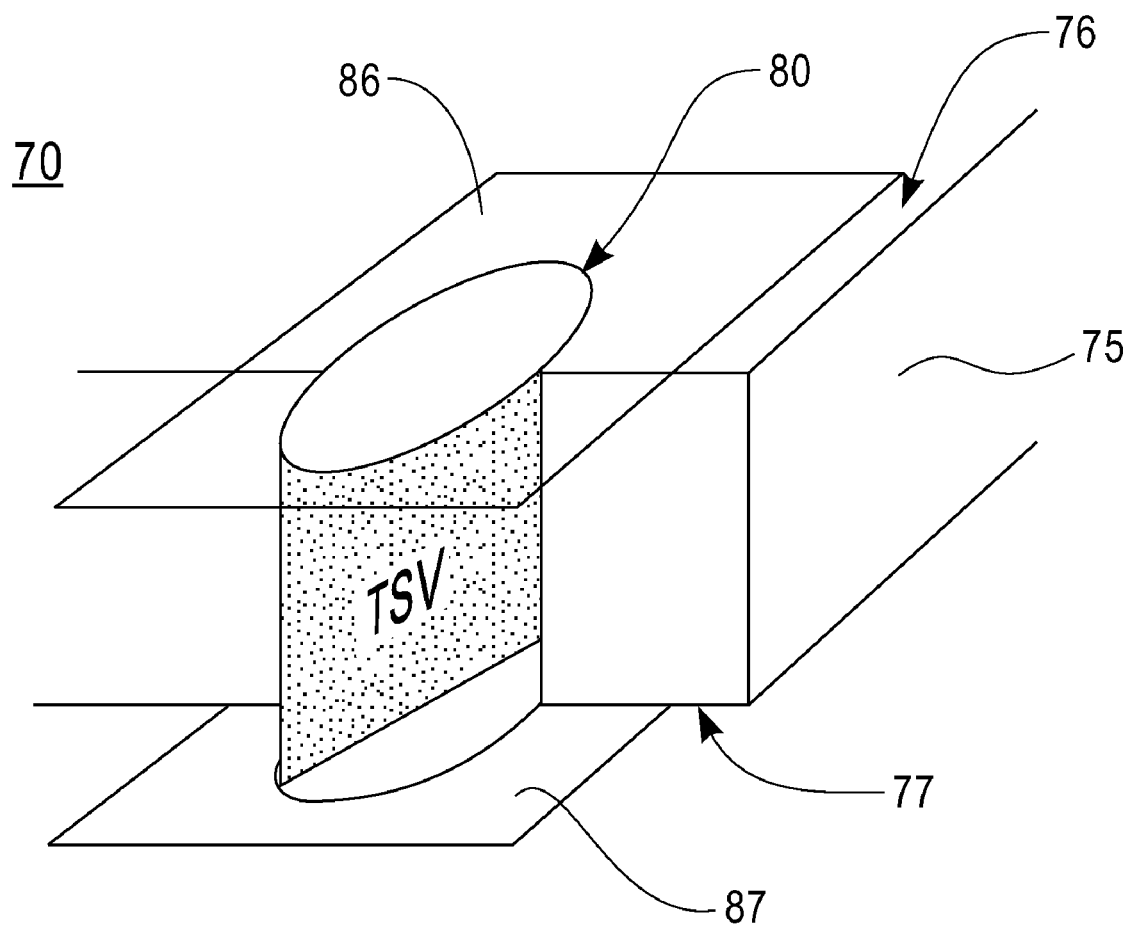
FIG. 3 is a schematic diagram of a semiconductor structure including a vertical TSV that can be implemented within alternative embodiments of the present invention.

FIG. 3 is a schematic diagram illustrating a semiconductor structure including a through silicon via that can be implemented within alternative embodiments of the present invention. As shown in FIG. 3, the semiconductor structure is similar to the semiconductor structures shown in FIGS. 1 and 2, except a dielectric insulation 24, 54 is absent, to thereby create a direct ground connection with the silicon surface. As shown in FIG. 3, a semiconductor structure 70 includes a silicon surface 75 having first and second planar surfaces 76 and 77, a through silicon via 80 filled with a conductive material 82, and landing pads 86 and 87 formed above and below the first and second planar surfaces 76 and 77. The through silicon via 80 creates a ground connection since a dielectric insulation is not provided on the sidewalls of the through silicon via 80. The through silicon via 80 serves to stiffen the ground substrate plane and enhances ground distribution.

According to an embodiment of the present invention, the through silicon vias shown in FIGS. 1 through 3 may be fabricated using various methods. According to one embodiment, the through silicon vias are formed by depositing approximately 1000 Angstroms (A) of silicon nitride $Si_3N_4$ on a substrate, to protect the surface via a low-pressure chemical vapor deposition (LPCVD) process, for example. The through silicon via is then defined and etched leaving silicon nitride on the surface. The sidewalls of the through silicon via are then oxidized by thermal oxidation to a desired thickness, for example. The through silicon via is then filled with a planarized organic (not shown). A hard mask layer (not shown) is then formed, that resists O2 plasma, the material being a low temperature sputtered oxide, for example.

In the case of a through silicon via having a thick dielectric insulation (as depicted in FIG. 1) or no dielectric insulation (as depicted in FIG. 3), the through silicon via is then masked using standard photolithographic techniques.

On the other hand, in the case of a through silicon via including a thin dielectric insulation (as depicted in FIG. 2) for example, openings are etched in the hard mask layer to expose the through silicon via filled with planarized organic. The exposed organic is then removed with an O2 plasma process and the hard mask layer is removed and the dielectric insulation from the exposed sidewalls. The wafer may be ashed to remove the organic from the through silicon via. The sidewalls of the through silicon via are then oxidized by a thermal oxidation process to a thickness desired for a thin dielectric insulation. The through silicon via is then filled with a planarized organic material and a hard mask layer (not shown) is deposited. The thin dielectric insulation is then masked with standard photolithographic techniques.

Next, nitride is removed then from the wafer surface if necessary. Further, the through silicon via is filled with a thin titanium (Ti) liner and tungsten (W) or copper (Cu) for example.

The present invention provides a through silicon via that can be tailored to enhance a defined function of the through silicon via. Thus, the through silicon via may be used in a manner which enhances signal transfer, power supply connection or ground connection, for example.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor structure comprising:
   at least one silicon substrate having first and second planar surfaces; and
   at least one through silicon via filled with a conductive material and extending vertically through the first planar surface of the at least one silicon substrate to the second planar surface thereof, so as to form a vertical interconnection between a plurality of electronic circuits, wherein an amount of dielectric insulation surrounding the through silicon via is varied based on a defined function of the through silicon via.

2. The semiconductor structure of claim 1, wherein the conductive material comprises one of tungsten or copper.

3. The semiconductor structure of claim 1, wherein the silicon substrate is one of a wafer or a device.

4. The semiconductor structure of claim 1, wherein the defined function of the through silicon via includes one of signal transfer, power supply connection, ground connection.

5. The semiconductor structure of claim 3, wherein the dielectric insulation is formed of a predetermined thickness along sidewalls of the through silicon via to sufficiently isolate the through silicon via from the silicon substrate when the through silicon via is filled with the conductive material.

6. The semiconductor structure of claim 5, wherein the dielectric insulation is relatively thick having a predetermined thickness sufficient to perform signal transfer with a minimum of parasitic capacitance.

7. The semiconductor structure of claim 5, wherein the dielectric insulation is thin having a predetermined thickness sufficiently thin to provide power supply decoupling capacitance.

8. The semiconductor structure of claim 5, wherein the dielectric insulation is thicker when performing signal transfer than when providing a power supply connection.

9. The semiconductor structure of claim 5, wherein the dielectric insulation is formed of a high-k dielectric material or a low-k dielectric material.

10. The semiconductor structure of claim 1, further comprising a plurality of landing pads respectively formed at the first and second planar surfaces of the silicon substrate, above and below the through silicon via.

11. A method of forming a through silicon via in a semiconductor structure, the method comprising:
    forming a through silicon via filled with a conductive material vertically extending through a first planar surface of a silicon substrate and a second planar surface thereof, to create a vertical interconnection between a plurality of electronic circuits; and
    varying an amount of dielectric insulation surrounding the through silicon via based on a defined function of the through silicon via.

12. The method of claim 11, wherein the conductive material comprises one of tungsten or copper.

13. The method of claim 11, wherein the silicon substrate is one of a wafer or a device.

14. The method of claim 11, wherein the defined function of the through silicon via includes one of signal transfer, power supply connection and ground connection.

15. The method of claim 14, wherein varying an amount of dielectric insulation comprises varying a thickness of the dielectric insulation formed along sidewalls of the through silicon via to sufficiently isolate the through silicon via from the silicon substrate when the through silicon via is filled with the conductive material.

16. The method of claim 15, wherein the dielectric insulation is relatively thick having a thickness sufficient for performing signal transfer with a minimum of parasitic capacitance.

17. The method of claim 15, wherein the dielectric insulation is thin having a thickness sufficiently thin for providing power supply decoupling capacitance.

18. The method of claim 15, wherein the dielectric insulation is thicker when performing signal transfer than when providing a power supply connection.

* * * * *